US012805075B2

(12) United States Patent
Shigitani et al.

(10) Patent No.: US 12,805,075 B2
(45) Date of Patent: Nov. 17, 2026

(54) NEAR-INFRARED LIGHT-EMITTING DEVICE INCLUDING A WAVELENGTH CONVERTER AND REFLECTIVE OPTICAL MEMBER

(71) Applicant: Panasonic Intellectual Property Management Co., Ltd., Osaka (JP)

(72) Inventors: Ryosuke Shigitani, Osaka (JP); Mitsuru Nitta, Kyoto (JP); Shozo Oshio, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 406 days.

(21) Appl. No.: 18/292,043

(22) PCT Filed: Jun. 27, 2022

(86) PCT No.: PCT/JP2022/025444

§ 371 (c)(1),
(2) Date: Jan. 25, 2024

(87) PCT Pub. No.: WO2023/008028

PCT Pub. Date: Feb. 2, 2023

(65) Prior Publication Data

US 2024/0347677 A1 Oct. 17, 2024

(30) Foreign Application Priority Data

Jul. 29, 2021 (JP) ................................ 2021-124398

(51) Int. Cl.
*H10H 20/851* (2025.01)

(52) U.S. Cl.
CPC .... *H10H 20/8512* (2025.01); *H10H 20/8515* (2025.01)

(58) Field of Classification Search
CPC ...... H10H 20/851–8516; H10H 29/851–8516; H10H 20/855–856;
(Continued)

(56) References Cited

U.S. PATENT DOCUMENTS 3,932,881 A * 1/1976 Mita .................. H10H 20/8512 359/360
2004/0150316 A1* 8/2004 Setlur ................ C09K 11/7739 313/486

(Continued)

FOREIGN PATENT DOCUMENTS

CN 108604628 A * 9/2018 ........... H10H 20/855
CN 112151660 A 12/2020

(Continued)

OTHER PUBLICATIONS

Office Action for corresponding EP Application No. 22 849 100.7 dated Oct. 15, 2025.

(Continued)

*Primary Examiner* — Scott B Geyer
(74) *Attorney, Agent, or Firm* — Renner, Otto, Boisselle & Sklar, LLP

(57) ABSTRACT

Provided is a light emitting device including a solid-state light-emitting element that emits primary light, a wavelength converter that includes a phosphor containing a fluorescent ion which absorbs the primary light on the basis of a forbidden transition-type electronic energy transition, and an optical member that reflects the primary light while transmitting fluorescence emitted by the fluorescent ion. The solid-state light-emitting element is arranged on a side of one surface of the wavelength converter and the optical member is arranged on a side of the other surface. The fluorescence emitted by the fluorescent ion passes through the optical member and is output to the outside of the light (Continued)

emitting device. An electronic apparatus includes the above-described light emitting device.

8 Claims, 5 Drawing Sheets

(58) Field of Classification Search
CPC ...... H10H 29/855-856; C09K 11/7776; C09K 11/7708; C09K 11/7728; C09K 11/7783
See application file for complete search history.

(56) References Cited

U.S. PATENT DOCUMENTS

| | | | | |
|---|---|---|---|---|
| 2007/0182299 | A1* | 8/2007 | Ouderkirk | H10H 20/8515 313/110 |
| 2010/0052504 | A1* | 3/2010 | Sato | C09K 11/08 257/E33.001 |
| 2010/0176751 | A1* | 7/2010 | Oshio | H10H 20/857 257/E33.001 |
| 2010/0327164 | A1* | 12/2010 | Costello | G01D 5/34715 29/832 |
| 2014/0264412 | A1 | 9/2014 | Yoon et al. | |
| 2015/0318449 | A1* | 11/2015 | Rantala | H10W 90/00 438/27 |
| 2015/0325764 | A1* | 11/2015 | Rantala | H10H 20/8581 257/76 |
| 2015/0344775 | A1* | 12/2015 | Oshio | C09K 11/7792 252/301.4 F |
| 2016/0000018 | A1* | 1/2016 | Van Elmpt | A01G 7/045 47/17 |
| 2016/0149090 | A1* | 5/2016 | Göötz | H10H 20/8512 250/338.4 |
| 2017/0030555 | A1* | 2/2017 | Lalicki | F21V 9/30 |
| 2018/0182942 | A1 | 6/2018 | Yuasa et al. | |
| 2018/0358514 | A1 | 12/2018 | Tragl et al. | |
| 2019/0088832 | A1* | 3/2019 | Onuma | H10H 20/8513 |
| 2019/0194539 | A1* | 6/2019 | Rajendran | H10H 20/8512 |
| 2019/0233723 | A1* | 8/2019 | Lee | H10H 20/8512 |
| 2020/0035869 | A1 | 1/2020 | Schrama | |
| 2020/0109331 | A1* | 4/2020 | Oshio | H10H 20/8512 |
| 2020/0220053 | A1 | 7/2020 | Schmidt et al. | |
| 2021/0015052 | A1* | 1/2021 | Li | A01G 7/045 |
| 2021/0036192 | A1* | 2/2021 | Yamada | H10H 20/8513 |
| 2021/0043809 | A1* | 2/2021 | Katou | H10H 20/8513 |
| 2021/0098659 | A1 | 4/2021 | Iwasa et al. | |
| 2021/0175398 | A1* | 6/2021 | Kashihara | H10H 20/854 |
| 2021/0403808 | A1* | 12/2021 | Liu | C09K 11/7776 |
| 2022/0173079 | A1* | 6/2022 | Pan | H10W 90/00 |
| 2022/0199869 | A1* | 6/2022 | Jia | H10H 20/8513 |
| 2022/0239057 | A1* | 7/2022 | Nitta | H01S 5/0087 |
| 2023/0238768 | A1* | 7/2023 | Nitta | A61B 1/00105 372/43.01 |
| 2024/0279546 | A1* | 8/2024 | Nitta | C09K 11/7708 |
| 2024/0304764 | A1* | 9/2024 | Oshio | C09K 11/77742 |

FOREIGN PATENT DOCUMENTS

| | | | | | |
|---|---|---|---|---|---|
| CN | 113410372 | A | * | 9/2021 | H10H 20/855 |
| EP | 0 936 682 | A1 | | 8/1999 | |
| EP | 3799138 | A1 | | 3/2021 | |
| EP | 4086323 | A1 | * | 11/2022 | C09K 11/7736 |
| JP | 2003-162240 | A | | 6/2003 | |
| JP | 3503139 | B | | 12/2003 | |
| JP | 2006-186022 | A | | 7/2006 | |
| JP | 2008-116900 | A | | 5/2008 | |
| JP | 6570653 | B2 | | 9/2019 | |
| JP | 2020-181995 | A | | 11/2020 | |
| JP | 2021032971 | A | | 3/2021 | |
| JP | 2021-57415 | A | | 4/2021 | |
| JP | 2021057415 | A | * | 4/2021 | H10H 20/8515 |
| JP | 2021-132176 | A | | 9/2021 | |
| KR | 20200112611 | A | * | 10/2020 | F21V 23/005 |
| KR | 20210112806 | A | * | 9/2021 | H10H 20/856 |
| TW | I361215 | B | * | 4/2012 | H01J 61/44 |
| WO | WO-2010053341 | A1 | * | 5/2010 | C09K 11/643 |
| WO | WO-2018172255 | A1 | * | 9/2018 | H10W 90/00 |
| WO | WO-2022131254 | A1 | * | 6/2022 | H10W 90/00 |

OTHER PUBLICATIONS

Extended European Search Report for Corresponding EP Application No. 22849100.7 dated Oct. 4, 2024.
International Search Report for corresponding Application No. PCT/JP2022/025444, mailed Aug. 2, 2022.
Written Opinion for corresponding Application No. PCT/JP2022/025444, mailed Aug. 2, 2022.

* cited by examiner

NEAR-INFRARED LIGHT-EMITTING DEVICE INCLUDING A WAVELENGTH CONVERTER AND REFLECTIVE OPTICAL MEMBER

TECHNICAL FIELD

The present invention relates to a light emitting device and an electronic apparatus.

BACKGROUND ART

There are prior known light emitting devices that are obtained by combining a solid-state light-emitting element and a phosphor and that emit output light. Most of the light emitting devices output, as a light component of output light, primary light emitted by the solid-state light-emitting element (see Patent Literature 1).

In applications where the light component of output primary light is detrimental, an optical filter for cutting the primary light is used to suppress the primary light from being output from the light emitting device. Specifically, Patent Literature 2 discloses a beam emission-type optoelectronic device. The optoelectronic device includes a semiconductor chip that emits a primary beam when the optoelectronic device is operated, and a conversion element containing a conversion material. Patent Literature 2 describes that when the primary beam is not desired to be emitted into the surrounding environment, the emission can be prevented by using a filter. It is further described that the filter can be a material that absorbs a blue, green, or red primary beam but transmits a secondary beam, or a dielectric mirror that selectively reflects a blue, green, or red primary beam.

CITATION LIST

Patent Literature

Patent Literature 1: Japanese Patent No. 3503139

Patent Literature 2: Japanese Patent No. 6570653

SUMMARY OF INVENTION

However, a conventional light emitting device that is obtained by combining a solid-state light-emitting element and a phosphor and that emits output light has difficulty in increasing the output intensity of fluorescence emitted from the phosphor. This issue is remarkable in a light emitting device that utilizes a phosphor containing, as a light emission center, a fluorescent ion exhibiting light absorption based on a forbidden transition-type electronic energy transition.

The present invention has been made in consideration of such issues as described above, which are inherent in related art. An object of the present invention is to provide a light emitting device obtained by combining a solid-state light-emitting element and a phosphor exhibiting light absorption based on a forbidden transition-type electronic energy transition and capable of enhancing the output intensity of fluorescence emitted from the phosphor. Further, an object of the present invention is to provide an electronic apparatus using a light emitting device having an enhanced fluorescence output intensity.

In response to the above issues, a light emitting device according to a first aspect of the present invention includes: a solid-state light-emitting element that emits primary light;

a wavelength converter that includes a phosphor containing a fluorescent ion which absorbs the primary light on the basis of a forbidden transition-type electronic energy transition; and an optical member that reflects the primary light while transmitting fluorescence emitted by the fluorescent ion. Further, the solid-state light-emitting element is arranged on a side of one surface of the wavelength converter and the optical member is arranged on a side of the other surface of the wavelength converter. In the light emitting device, the fluorescence emitted by the fluorescent ion passes through the optical member and is output to the outside.

An electronic apparatus according to a second aspect of the present invention includes the above-described light emitting device.

BRIEF DESCRIPTION OF DRAWINGS

FIG. 4(*b*) is a graph illustrating spectral distributions of output light emitted by light emitting devices of example 2 and comparative example 2. FIG. 4(*c*) is a graph illustrating spectral distributions of output light emitted by light emitting devices of example 3 and comparative example 3. FIG. 4(*d*) is a graph illustrating spectral distributions of output light emitted by light emitting devices of example 4 and comparative example 4.

FIG. 5(*b*) is a graph illustrating spectral characteristics of an interference filter used in example 6. FIG. 5(*c*) is a graph illustrating spectral characteristics of an interference filter used in example 7. FIG. 5(*d*) is a graph illustrating spectral characteristics of an interference filter used in example 8.

DESCRIPTION OF EMBODIMENTS

Figure 1A:
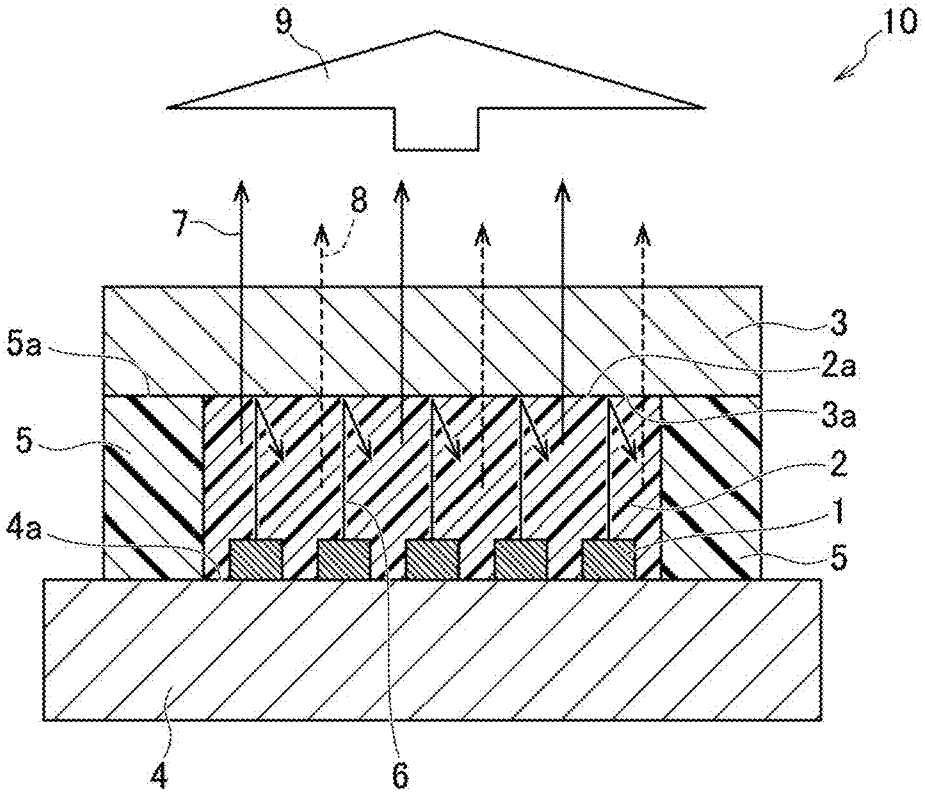
FIG. 1A is a schematic cross-sectional view illustrating an example of a light emitting device according to a present embodiment.

A light emitting device and an electronic apparatus provided with the light emitting device according to the present embodiment will be described below with reference to the drawings. Note that dimensional ratios in the drawings are exaggerated for convenience of the description and are sometimes different from actual ratios.

In a conventional light emitting device that is obtained by combining a solid-state light-emitting element and a phosphor, as described above, it is sometimes difficult to increase the output intensity of fluorescence emitted by the phosphor. In particular, it is remarkable in a light emitting device utilizing a phosphor containing a fluorescent ion that exhibits its light absorption based on a forbidden transition-type electronic energy transition. Similarly, a conventional light emitting device that emits near-infrared light using a phosphor exhibiting forbidden transition-type light absorption also has difficulty in enhancing the output intensity of near-infrared light.

The reason why the output intensity of fluorescence is low in these light emitting devices is that the light absorption rate of a fluorescent ion exhibiting forbidden transition-type light absorption is small in the principle of fluorescence. As a result, many of the photons of primary light that excites the phosphor are output from the light emitting device without participating in wavelength conversion.

Here, in the light emitting device using, as a fluorescent film, a fluorescent ion (for example, $Ce^{3+}$ and $Eu^{2+}$) exhibiting allowed transition-type light absorption, the light absorption rate of the fluorescent ion is large, and a thick fluorescent film is not required. Thus, in the light emitting device, the light absorption rate of the fluorescent film can be increased by increasing the thickness of the fluorescent film, and as a result, the effect of increasing the output intensity of fluorescence can be obtained.

However, in the light emitting device using a fluorescent ion (for example, $Cr^{3+}$) exhibiting forbidden transition-type light absorption for the fluorescent film, the light absorption rate of the fluorescent ion is small, and thus a thick fluorescent film is required from the beginning. When attempts were made to further increase the thickness of fluorescent film to increase the light absorption rate, the photons of fluorescence emitted by the fluorescent ion were absorbed by impurities or defects in the fluorescent film and were deactivated, sometimes resulting in a decrease in fluorescence intensity.

A light emitting device according to the present embodiment is a device capable of, even when a phosphor exhibiting light absorption based on a forbidden transition-type electronic energy transition is used, increasing the output intensity of fluorescence due to the phosphor.

[Light Emitting Device]

As illustrated in FIG. 1A, a light emitting device 10 of the present embodiment includes a solid-state light-emitting element 1 emitting primary light, and a wavelength converter 2 including a phosphor having a property of absorbing primary light and converting it into a light component having a longer wavelength than that of the primary light. The light emitting device 10 further includes an optical member 3 having the property of reflecting primary light and transmitting fluorescence emitted by the phosphor included in the wavelength converter 2.

As illustrated in FIG. 1A, the solid-state light-emitting element 1 is mounted on a surface (main surface) 4*a* of a substrate 4. For the solid-state light-emitting element 1, for example, a light emitting diode (LED) or a laser diode may be used. By using, for example, an LED module or a laser diode and the like that emits high-energy light of 1 W or more, the light emitting device can be expected to have a light output of a several hundred mW class. In addition, by using an LED module and the like that emits high-energy light of 3 W or more or 10 W or more, the light emitting device can be expected to have a light output of a several W class. Furthermore, by using an LED module and the like that emits high-energy light of 30 W or more, the light emitting device can be expected to have a light output exceeding 10 W. Furthermore, by using an LED module and the like that emits high-energy light of 100 W or more, the light emitting device can be expected to have a light output exceeding 30 W.

Using a laser diode as the solid-state light-emitting element 1 and laser light as the primary light results in a specification in which the wavelength converter 2 is irradiated with high-density spot light. Thus, the light emitting device obtained can be used as a high-power point light source, and it therefore becomes possible to expand the range of industrial applications of solid-state lighting. As such a laser diode, for example, it is possible to use an edge emitting laser (EEL), a vertical cavity surface emitting laser (VCSEL), or the like.

The primary light emitted by the solid-state light-emitting element 1 is preferably blue light having a maximum intensity value within a wavelength range of 435 nm or more and less than 480 nm. Since it is easy to procure a solid-state light-emitting element that emits blue light with high output and high efficiency, it is easy to achieve high output and high efficiency of the light emitting device, and further it is advantageous for industrial manufacturing of the light emitting device.

Note that the number of solid-state light-emitting elements 1 mounted on the substrate 4 is not particularly limited, and there may be a single solid-state light-emitting element or multiple solid-state light-emitting elements. As illustrated in FIG. 1A, when there are multiple solid-state light-emitting elements 1, the output of the primary light can be easily increased, and this makes the light emitting device advantageous for increasing the output.

The number of solid-state light-emitting elements 1 is not particularly limited and may be appropriately selected from, for example, 9 or more, 16 or more, 25 or more, 36 or more, 49 or more, 64 or more, 81 or more, and 100 or more. The upper limit of the number is not particularly limited and may be appropriately selected from, for example, 9 or less, 16 or less, 25 or less, 36 or less, 49 or less, 64 or less, 81 or less, and 100 or less.

In the light emitting device 10, the solid-state light-emitting element 1 is preferably a surface emitting light source of a surface light emitting type. This can suppresses variation in intensity distribution and unevenness in color tone of the primary light radiated on the wavelength converter 2, and thus the light emitting device is made advantageous in suppressing unevenness in the intensity distribution of the output light.

Although the material of the substrate 4 is not particularly limited, it can have light reflectivity. For such a substrate 4, for example, a substrate made from metal can be used, and specifically, a substrate made from aluminum can be used. For the substrate 4, a substrate made from ceramic can be used, for example, and specifically, a substrate made from alumina can be used.

As illustrated in FIG. 1A, a sidewall 5 is erected upward from the surface 4*a* around multiple solid-state light-emitting elements 1 mounted on the surface 4*a* of the substrate 4. Providing the sidewall 5 in this manner results in a device configuration that is advantageous for controlling the thickness of the wavelength converter 2 and the area of the light output surface. The sidewall 5 is formed to surround the entirety of the multiple solid-state light-emitting elements 1. In the light emitting device 10 of FIG. 1A, the sidewall 5 is formed in an annular shape so as to surround the entirety of the multiple solid-state light-emitting elements 1 when viewed in plan view.

Although the material of the sidewall 5 is not particularly limited, it can have light reflectivity, and for example, resin or metal containing a light reflective material can be used.

The wavelength converter 2 is provided in an internal space formed by the substrate 4 and the sidewall 5. Multiple solid-state light-emitting elements 1 are arranged on the side of one surface (lower surface) of the wavelength converter 2.

The wavelength converter 2 contains a phosphor, and the phosphor contains a fluorescent ion that absorbs primary light on the basis of a forbidden transition-type electronic energy transition. As such a forbidden transition-type phosphor, a phosphor that emits fluorescence based on an electronic energy transition of a transition metal ion can be used, and for example, a phosphor containing at least one ion selected from the group consisting of Cr, Mn, Fe, Cu, and Ni as an activator can be used. Note that since the light absorption of such a phosphor is due to a forbidden transition, the absorption rate of the primary light decreases.

To describe in detail, the activator for the phosphor contained in the wavelength converter 2 is a fluorescent ion that has the property of absorbing excitation light (primary light 6) emitted from the solid-state light-emitting element 1 and converting it into a light component having a longer wavelength than that of the excitation light. The activator of the phosphor is an ion capable of emitting fluorescence due to a forbidden transition, preferably at least one of $Cr^{3+}$ or $Mn^{4+}$, for example.

The phosphor contained in the wavelength converter 2 is, in consideration of durability and reliability, preferably an inorganic crystal to which the activator described above is added. The inorganic crystal is preferably an artificial mineral whose fluorescence characteristics can be easily controlled. Thus, the phosphor contained in the wavelength converter 2 is preferably at least one selected from the group consisting of a metal oxide, metal nitride, metal oxynitride, composite metal oxide, composite metal nitride, and composite metal oxynitride that are activated with the above-described activator. The phosphor is preferably an inorganic compound having a garnet-type crystal structure or a perovskite-type crystal structure.

The phosphor contained in the wavelength converter 2 may be at least one selected from the group consisting of halophosphate, phosphate, halosilicate, silicate, aluminate, aluminosilicate, borate, germanate, silicate nitride, aluminosilicate nitride, silicate oxynitride, and aluminosilicate oxynitride that are activated with the above-described activator. Thus, from these, the phosphor may be used by selecting one that is suitable for the lighting design as appropriate.

Here, the activator of the phosphor, that is fluorescent ion, contained in the wavelength converter 2 is preferably $Cr^{3+}$. By using $Cr^{3+}$, it is possible to obtain a phosphor having the property of absorbing visible light, particularly blue light or red light, and converting it into a light component of deep red to near infrared. Thus, the light emitting device 10 is advantageous for obtaining a near-infrared output light component that can be used for near-infrared spectroscopy. It also becomes easy to change the light absorption peak wavelength and fluorescence peak wavelength of the phosphor depending on the type of matrix to which the activator is added, which is advantageous in changing the excitation spectrum shape and fluorescence spectrum shape. In addition, there are many known phosphors activated with $Cr^{3+}$ that absorbs blue light and red light and converts them into a near-infrared fluorescent component. This not only widens the range of selection of the solid-state light-emitting element 1 that emits primary light, but also makes it easy to change the peak wavelength of fluorescence emitted by the phosphor, thereby making the light emitting device 10 advantageous for controlling the spectral distribution of output light.

Note that a phosphor in which the fluorescent ion is $Cr^{3+}$ is not particularly limited as long as it absorbs excitation light (primary light 6) and converts it into fluorescence having a longer wavelength than that of the excitation light, and may be appropriately selected from known $Cr^{3+}$-activated phosphors. However, it is preferable that the $Cr^{3+}$-activated phosphor be a phosphor with a composite metal oxide as a matrix, which is easy to manufacture.

It is preferable that the $Cr^{3+}$-activated phosphor be a composite oxide phosphor having a garnet-type crystal structure with many practical results. Such a $Cr^{3+}$-activated garnet phosphor can be at least one selected from the group consisting of: $Y_3Al_2(AlO_4)_3:Cr^{3+}$, $La_3Al_2(AlO_4)_3:Cr^{3+}$, $Gd_3Al_2(AlO_4)_3:Cr^{3+}$, $Y_3Ga_2(AlO_4)_3:Cr^{3+}$, $La_3Ga_2(AlO_4)_3:Cr^{3+}$, $Gd_3Ga_2(AlO_4)_3:Cr^{3+}$, $Y_3Sc_2(AlO_4)_3:Cr^{3+}$, $La_3Sc_2(AlO_4)_3:Cr^{3+}$, $Gd_3Sc_2(AlO_4)_3:Cr^{3+}$, $Y_3Ga_2(GaO_4)_3:Cr^{3+}$, $La_3Ga_2(GaO_4)_3:Cr^{3+}$, $(Gd, La)_3Ga_2(GaO_4)_3:Cr^{3+}$, $Gd_3Ga_2(GaO_4)_3:Cr^{3+}$, $Y_3Sc_2(GaO_4)_3:Cr^{3+}$, $La_3Sc_2(GaO_4)_3:Cr^{3+}$, $Gd_3Sc_2(GaO_4)_3:Cr^{3+}$, and $(Gd, La)_3(Ga, Sc)_2(GaO_4)_3:Cr^{3+}$. The $Cr^{3+}$ activated garnet phosphor may be a solid solution having a phosphor described above as an end component.

The wavelength converter 2 can be manufactured by sealing the phosphor with a sealant. It is preferable that the sealant be at least one of an organic material or an inorganic material, particularly at least one of a transparent (translucent) organic material or a transparent (translucent) inorganic material. Examples of the sealant of the organic material includes a transparent organic material such as silicone resin. Examples of the sealant of the inorganic material includes a transparent inorganic material such as low melting point glass.

As the wavelength converter 2, a sintered body formed by sintering a phosphor and having multiple voids therein can be used. Furthermore, as the wavelength converter 2, a ceramic body formed by sintering a phosphor and not having multiple voids therein can be used. Due to the wavelength converter 2 being such a sintered body or ceramic body, the manufacturing and handling of the wavelength converter 2 become easy, therefore resulting in a wavelength converter that is suitable for industrial production. Furthermore, since fluorescent ions are distributed densely in the thickness direction due to such a sintered body or ceramic body, it becomes easy to relatively increase the light absorption rate of the wavelength converter and it becomes possible to increase the output ratio of the fluorescence.

Here, as described above, the wavelength converter 2 contains at least a phosphor that absorbs primary light on the basis of a forbidden transition-type electronic energy transition (forbidden transition-type phosphor). However, the wavelength converter 2 may contain a phosphor that absorbs primary light on the basis of an allowed transition-type electronic energy transition (allowed transition-type phosphor). For example, the wavelength converter 2 may contain a phosphor containing at least one activator selected from the group consisting of $Ce^{3+}$, $Eu^{2+}$, and $Yb^{2+}$. However, it is preferable that the phosphor contained in the wavelength converter 2 include more of the forbidden transition-type phosphor than the allowed transition-type phosphor. It is also preferable that the phosphor contained in the wavelength converter 2 be only a forbidden transition-type phosphor. Since the forbidden transition-type phosphor can absorb primary light emitted from the solid-state light-emitting element 1 and emit a near-infrared fluorescent component, the light emitting device 10 becomes an advantageous device for applications such as near-infrared spectroscopy.

As described above, the wavelength converter 2 contains a forbidden transition-type phosphor. Thus, the light absorption rate of blue light having a wavelength of 450 nm in a wavelength converter 2 having a thickness of 100 μm or more and less than 300 μm is, for example, 40% or more and less than 65%. This light absorption rate is characterized by being small compared to the blue light absorption rate (approximately 80% or more) in a general wavelength converter for white LED lighting having a similar thickness. The light absorption rate of red light having a wavelength of 660 nm in a wavelength converter 2 having a thickness of 150 μm or more and less than 200 μm is characterized by being 20% or more and less than 40%, for example. Note that a general wavelength converter for white LED lighting contains a $Ce^{3+}$-activated green phosphor and an $Eu^{2+}$-activated red phosphor, and the light absorption rate of blue light is 80% or more.

The light emitting device 10 includes the optical member 3, and the optical member 3 is arranged on the side of the other surface (upper surface) opposite to one surface (lower surface) of the wavelength converter 2. As illustrated in FIG. 1A, the optical member 3 covers the entirety of the other surface (upper surface) 2*a* of the wavelength converter 2 and is further in contact with an upper surface 5*a* of the side wall 5. The optical member 3 has the characteristics of reflecting primary light and transmitting fluorescence emitted by the forbidden transition-type phosphor contained in the wavelength converter 2.

In the light emitting device 10, the optical member 3 is preferably a member made of only an inorganic material. Since the optical member 3 made of only an inorganic material is excellent in heat resistance and durability, a light emitting device having improved heat resistance and durability can be obtained.

The optical member 3 preferably has a dielectric multilayer film structure. Thus, the optical interference effect observed in the multilayer structure of dielectrics having different permittivities can be utilized to obtain the optical characteristics of reflecting primary light while transmitting fluorescence emitted by the fluorescent ion.

The optical member 3 is preferably an optical interference filter. The optical interference filter is made by forming a dielectric thin film on the surface of a substrate. The dielectric thin film utilizes the fact that light transmission characteristics change due to interference of reflections occurring at interfaces between air and a dielectric, between a dielectric and a substrate, and between different dielectrics. By using such an optical interference filter, it becomes possible to reduce the transmittance of primary light while relatively increasing the transmittance of a fluorescent component emitted by the phosphor. Since the optical interference filter is easy to change the design and obtain, it becomes possible to configure a desired light emitting device relatively easily.

The action of the light emitting device 10 of the present embodiment having such a configuration will be described. As illustrated in FIG. 1A, in the light emitting device 10, when power is first applied to the solid-state light-emitting element 1 of the light emitting device 10, primary light 6 is emitted upward from the solid-state light-emitting element 1. The emitted primary light 6 passes through the wavelength converter 2, and part of the primary light 6 is absorbed by the fluorescent ion contained in the wavelength converter 2. The electronic energy transition of the fluorescent ion causes the primary light 6 to be converted to first fluorescence 7 as wavelength-converted light and emitted from the phosphor.

Here, as described above, the phosphor contained in the wavelength converter 2 absorbs the primary light 6 on the basis of a forbidden transition-type electronic energy transition, and thus the absorption rate of the primary light 6 is low. Thus, part of the primary light 6 is not absorbed by the phosphor and passes through the wavelength converter 2 to reach the optical member 3. As described above, the optical member 3 has the characteristics of reflecting primary light while transmitting fluorescence emitted by the phosphor. Thus, the primary light 6 reaching the optical member 3 is reflected downward by the optical member 3 and again passes through the wavelength converter 2. Then, the reflected primary light 6 is absorbed by the phosphor in the wavelength converter 2. Then, part of the absorbed primary light 6 is again converted through the electronic energy transition of the fluorescent ion into second fluorescence 8 as the wavelength-converted light.

In contrast, the primary light 6 not absorbed by the phosphor is reflected again by the optical member 3, the substrate 4, and the side wall 5. Thus, after the primary light 6 is reflected by the optical member 3, the substrate 4, and/or the side wall 5, it is absorbed by the phosphor and converted to the second fluorescence 8 or it is reflected repeatedly until it is absorbed by a light absorber present in the wavelength converter 2, the optical member 3, the substrate 4, or the side wall 5 and is substantially lost.

Then, the first fluorescence 7 and the second fluorescence 8 generated through such a process pass through the wavelength converter 2 and the optical member 3, and are output from the light emitting device 10 as the output light 9.

Thus, in the light emitting device 10 of the present embodiment, the primary light 6 that is not absorbed by the phosphor when passing through the wavelength converter 2 and does not participated in the excitation of the fluorescent ion is reflected by the optical member 3. Then, after the reflected primary light 6 is re-radiated to the phosphor and participates in the re-excitation of the fluorescent ion, the generated second fluorescence 8 is output from the light emitting device 10 together with the first fluorescence 7. Thus, even when the optical absorption rate of the phosphor used is small, it becomes possible to increase the conversion efficiency of the primary light 6 and enhance the fluorescence intensity of the output light 9 emitted from the light emitting device 10.

For example, even when the wavelength converter 2 having a low concentration of the light absorbing fluorescent ion and not expected to have a large light absorption is used, the light emitting device 10 capable of enhancing the fluorescence output can be obtained.

Note that in the light emitting device 10, it is preferable that at least one of the substrate 4 or the side wall 5 reflect at least one light of the primary light 6, the first fluorescence 7, or the second fluorescence 8. It is more preferable that both the substrate 4 and the side wall 5 reflect the primary light 6, the first fluorescence 7, and the second fluorescence 8. Thus, it is possible to suppress the loss of photons of the primary light 6, the first fluorescence 7, and the second fluorescence 8 due to light absorption into the substrate 4 and the side wall 5. Thus, the light emitting device 10 can increase the output of the output light 9 including the first fluorescence 7 and the second fluorescence 8.

As described above, the wavelength converter 2 absorbs primary light 6 emitted by the solid-state light-emitting element 1 and converts it into first fluorescence 7 having a longer wavelength than that of the primary light 6, and absorbs primary light 6 reflected by the optical member 3 and converts it into second fluorescence 8 having a longer wavelength than that of the primary light 6. Here, in the intensity of light components making up the output light 9 and derived from fluorescence emitted by the fluorescent ion, the percentage of the second fluorescence 8 is preferably 3% or more, and more preferably more than 5%. That is, in the output light 9 emitted from the light emitting device 10, the percentage of the intensity of the second fluorescence 8 relative to the intensity of light components obtained by adding the first fluorescence 7 and the second fluorescence 8 together is preferably 3% or more, and more preferably more than 5%. The above percentage of the intensity of the second fluorescence 8 is more preferably more than 10%, even more preferably more than 15%, and particularly preferably more than 30%. That is, the enhancement of the first fluorescence by the second fluorescence is preferably at least 3% or more and particularly preferably more than 30%, of the intensity of the first fluorescence. With such a configuration, fluorescence in which the second fluorescence 8 is clearly added to the first fluorescence 7 is output. Therefore, the light emitting device 10 emits output light 9 having a strong intensity of fluorescence due to the fluorescent ion.

Note that "the percentage of the second fluorescence in the intensity of light components derived from fluorescence emitted by the fluorescent ion" can be obtained by subtracting "the fluorescence intensity at the fluorescence peak wavelength of the output light measured after the optical member is removed from the light emitting device" from "the fluorescence intensity at the fluorescence peak wavelength of the output light of the light emitting device" and dividing by "the fluorescence intensity at the fluorescence peak wavelength of the output light of the light emitting device". That is, "the percentage of the second fluorescence in the intensity of light components derived from fluorescence emitted by the fluorescent ion" can be obtained by subtracting "the intensity of the first fluorescence" from "the total intensity of the first fluorescence and the second fluorescence" and dividing by "the total intensity of the first fluorescence and the second fluorescence".

In the light emitting device 10, the optical member 3 is preferably in direct contact with the wavelength converter 2. As illustrated in FIG. 1A, the surface (upper surface, the other surface) 2*a* facing the optical member 3 of the wavelength converter 2 and a surface (lower surface) 3*a* facing the wavelength converter 2 of the optical member 3 are preferably in contact with each other. When the wavelength converter 2 and the optical member 3 are in direct contact with each other, primary light 6 that is not absorbed by the fluorescent ion and does not participate in its excitation, is reflected by the optical member 3 without light diffusion and re-enters the wavelength converter 2. Thus, since the reflected primary light 6 acts to re-excite the fluorescent ion, photon loss due to the influence of the light absorption factor is suppressed. By contacting the wavelength converter 2 with the optical member 3 in this way, the reflected light by the optical member 3 can be efficiently used for re-excitation of the phosphor without loss, thereby making the light emitting device 10 advantageous for high output of fluorescence.

In the light emitting device 10, the optical member 3 is in direct contact with the wavelength converter 2, and further it is more preferable that the optical member 3 be made of only an inorganic material. When the optical member 3 is made of only an inorganic material, the optical member 3 has good thermal conductivity. Thus, since the optical member 3 is in contact with the wavelength converter 2, heat generated in the wavelength converter 2 due to energy loss of photons due to the wavelength conversion from primary light 6 to fluorescence can be conducted to the optical member 3 and emitted. Thus, the heat dissipation design of the light emitting device 10 can be facilitated to achieve high output.

Figure 1B:
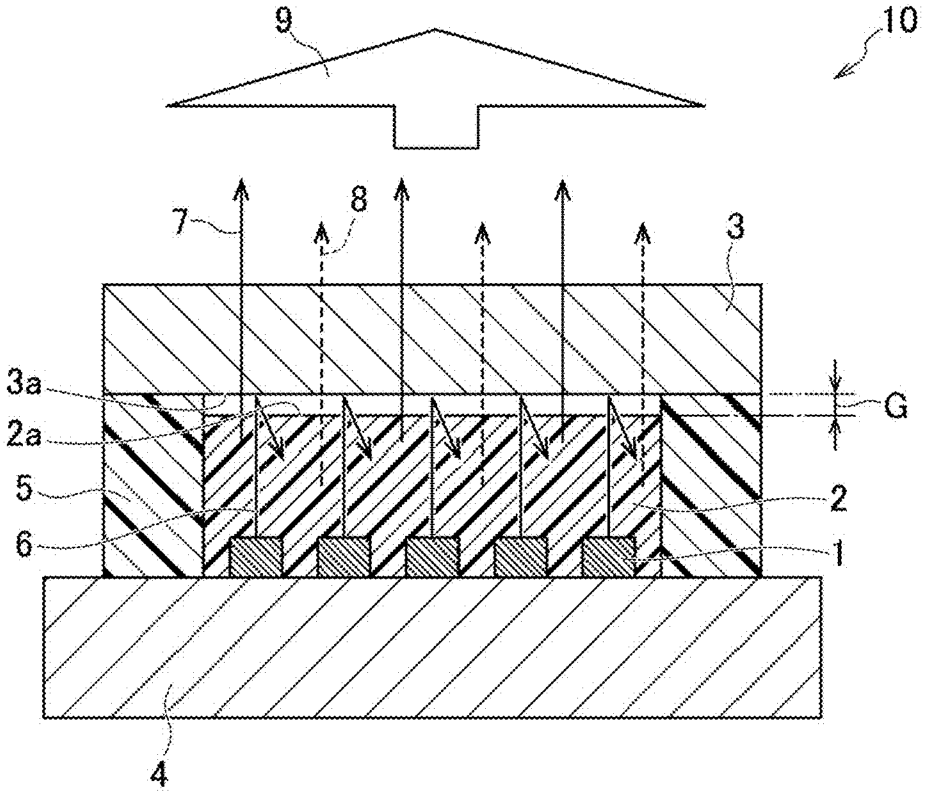
FIG. 1B is a schematic cross-sectional view illustrating another example of the light emitting device according to the present embodiment.

In the light emitting device 10, it is preferable that the wavelength converter 2 and the optical member 3 both include a plane as illustrated in FIG. 1B, and further be arranged so that the planes are parallel to each other. Specifically, it is preferable that the surface (upper surface) 2*a* facing the optical member 3 in the wavelength converter 2 and the surface (lower surface) 3*a* facing the wavelength converter 2 in the optical member 3 each include a plane and both planes be parallel to each other. Note that a gap distance G between the parallel planes is preferably smaller than 500 μm, and more preferably smaller than 250 μm. The above "plane" refers to a state where the unevenness state is less than ±100 μm, particularly less than 50 μm, and "include a plane" refers to a state where 40% or more, particularly 60% or more, of the upper surface of the wavelength converter and the lower surface of the optical member have a plane.

As described above, when the wavelength converter 2 and the optical member 3 are parallel and close to each other, primary light 6 that is not absorbed by the fluorescent ion and does not participate in the excitation is reflected by the optical member 3 without light diffusion and re-enters the wavelength converter 2. Hence, the reflected primary light 6 can be efficiently used for re-excitation of the phosphor, and thus the light emitting device 10 is advantageous for high output of fluorescence.

In the light emitting device 10, when there is a gap between the surface 2*a* of the wavelength converter 2 facing the optical member 3 and the surface 3*a* of the optical member 3 facing the wavelength converter 2, the gap distance G may be constant. Also, the gap distance G may be variable. By changing the gap distance G between the wavelength converter 2 and the optical member 3, it is possible to increase or decrease the light density of the primary light 6 reflected by the optical member 3 and re-entering the wavelength converter 2. Thus, the light emitting device 10 is advantageous for adjusting the intensity of light components derived from the fluorescence of the fluorescent ion, making up the output light 9. Note that the gap distance G can be changed by using a spacer, for example.

In the light emitting device 10, the optical member 3 preferably has a reflectance exceeding 90%, and more preferably exceeding 95%, in a wavelength range having an intensity exceeding 30% of the maximum intensity value in the spectral distribution of the primary light 6. The optical member 3 preferably has a reflectance exceeding 90%, and more preferably exceeding 95%, in a wavelength range having an intensity exceeding 10% of the maximum intensity value in the spectral distribution of the primary light 6. In this case, since the optical member 3 reflects the primary light 6 so as to sufficiently reduce the photon loss, it is possible to efficiently re-excite the fluorescent ion included in the wavelength converter 2.

The optical member 3 preferably has a transmittance exceeding 90%, and more preferably exceeding 95%, in a wavelength range having an intensity exceeding 50% of the maximum intensity value in the spectral distribution of the first fluorescence 7 and the second fluorescence 8. The optical member 3 preferably has a transmittance exceeding 90%, and more preferably exceeding 95%, in a wavelength range having an intensity exceeding 30% of the maximum intensity value in the spectral distribution of the first fluorescence 7 and the second fluorescence 8. In this case, since the optical member 3 transmits the first fluorescence 7 and the second fluorescence 8 so as to sufficiently reduce the photon loss, the light emitting device 10 outputs high-output fluorescence.

In the light emitting device 10, the first fluorescence and the second fluorescence preferably have fluorescence peaks within the wavelength range of 700 to 2,500 nm. Consequently, the output light 9 contains a high-output near-infrared ray, and thus the light emitting device 10 is advantageous for applications such as near-infrared spectroscopy.

In the light emitting device 10, the wavelength difference between a primary light wavelength taking the maximum intensity value of the primary light 6 and a first wavelength taking the maximum intensity value of the first fluorescence preferably exceeds 200 nm, and more preferably exceeds 300 nm. The optical member 3 may have a property in which the reflection wavelength band and the transmission wavelength band change according to the incident angle. Even in this case, when there is a sufficient wavelength difference between the reflected primary light 6 and the transmitted fluorescence (the first fluorescence and the second fluorescence), even when the primary light 6 or the fluorescence from the wavelength converter 2 obliquely enters the optical member 3, a light component having an undesired wavelength is less likely to be output. Thus, when the wavelength difference exceeds 200 nm, even when the primary light 6 or the fluorescence from the wavelength converter 2 obliquely enters the optical member 3, the light emitting device 10 reflects the primary light 6 and is advantageous for high output of fluorescence.

In the light emitting device 10, the primary light 6 is preferably blue light having a maximum intensity value within a wavelength region of 435 nm or more and less than 480 nm. Since the solid-state light-emitting element 1 emitting the high-output and high-efficiency primary light 6 is easy to procure, the light emitting device 10 is advantageous for high-output and high-efficiency, and industrial production.

In the light emitting device 10, the optical member 3 preferably reflects visible light and transmits near-infrared rays. Thus, the light emitting device 10 reflects visible light emitted by the solid-state light-emitting element 1 and transmits near-infrared rays emitted by the fluorescent ion, thereby outputting a high-output near-infrared ray suitable for near-infrared spectroscopy. The optical member 3 preferably has, in a range where the incident angle of light is 0° to 5°, a reflectance of 90% or more in a wavelength range of 350 nm or more and less than 500 nm, and a transmittance of 90% or more in a wavelength range of 750 nm or more and less than 1000 nm. As a result, since the optical member has the function of reflecting at least blue light and transmitting near-infrared light, it is advantageous to increase the output of the light emitting device 10 that extracts near-infrared fluorescence using the solid-state light-emitting element 1 emitting blue light.

As described above, the light emitting device 10 of the present embodiment includes the solid-state light-emitting element 1 that emits primary light 6 and the wavelength converter 2 that includes a phosphor containing a fluorescent ion which absorbs the primary light 6 on the basis of a forbidden transition-type electronic energy transition. The light emitting device 10 further includes the optical member 3 that reflects primary light 6 while transmitting fluorescence emitted by the fluorescent ion. The solid-state light-emitting element 1 is arranged on a side of one surface of the wavelength converter 2, and the optical member 3 is arranged on a side of the other surface of the wavelength converter 2. The fluorescence emitted by the fluorescent ion passes through the optical member 3 and is output to the outside of the light emitting device 10. In the light emitting device 10 of the present embodiment, primary light that was conventionally not absorbed by the phosphor and emitted without participating in the excitation of the fluorescent ion can be reflected by the optical member 3 and used for re-excitation of the phosphor. Thus, even in the case where a phosphor having a low absorption rate of primary light, such as a forbidden transition-type phosphor, is used, it is possible to obtain a light emitting device that emits output light 9 having a high intensity of fluorescence.

The light emitting device 10 of the present embodiment may be a light emitting device further including a white LED. For example, by mounting together with the white LED on the same substrate 4, a lighting apparatus can be configured which emits visible near-infrared integrated illumination light having a wavelength distribution ranging from the visible to the near-infrared region.

The light emitting device 10 thus configured can independently control the white light and the near-infrared light in a single device. Thus, the near-infrared light can be turned on or off according to the need for near-infrared sensing. In contrast, since only the near-infrared light invisible to the human eye can be turned on, it can be applied to sensing in a pitch-black space without disturbing the human sleep, for example. In this way, the light emitting device can perform sensing at any time of day or night without interfering with the human life.

A fluorescence enhancement method of the present embodiment is a method using the light emitting device 10 described above. The fluorescence enhancement method includes: a step of directly irradiating the wavelength converter 2 with primary light 6 emitted from the solid-state light-emitting element 1 to obtain first fluorescence 7; a step of reflecting, by the optical member 3, the primary light 6 that has passed through the wavelength converter 2 and thus indirectly irradiating the wavelength converter 2 with the primary light 6 to obtain second fluorescence 8; and a step of transmitting the first fluorescence 7 and the second fluorescence 8 through the optical member 3 to be output from the light emitting device 10.

In the fluorescence enhancement method of the present embodiment, since the primary light 6 not absorbed by the fluorescent ion of the phosphor, that is, the primary light 6 that has passed through the wavelength converter 2, is absorbed by the fluorescent ion, the absolute amount of light absorption by the fluorescent ion becomes large. Since the primary light 6 absorbed by the fluorescent ion is wavelength-converted to fluorescence with a predetermined wavelength conversion efficiency, as a result, the fluorescence intensity increases as the absolute amount of light absorption increases. Then, the generated fluorescence passes through the optical member 3 to be output, and thus the intensity of the desired fluorescence increases.

As described above, by using the fluorescence enhancement method, it becomes possible to increase light absorption by the phosphor and output as wavelength-converted light, even when a forbidden transition-type phosphor is used for which large optical absorption cannot be expected on the principle of fluorescence.

[Electronic Apparatus]

Next, an electronic apparatus according to the present embodiment will be described. An electronic apparatus according to the present embodiment includes the light emitting device 10 described above. The light emitting device 10 is obtained by combining the solid-state light-emitting element 1, the wavelength converter 2, and the optical member 3, and can emit high-output light, particularly a high-output near-infrared ray. Consequently, it is possible to provide an electronic apparatus that can be made compact and further has a near-infrared spectroscopy function.

Figure 2:
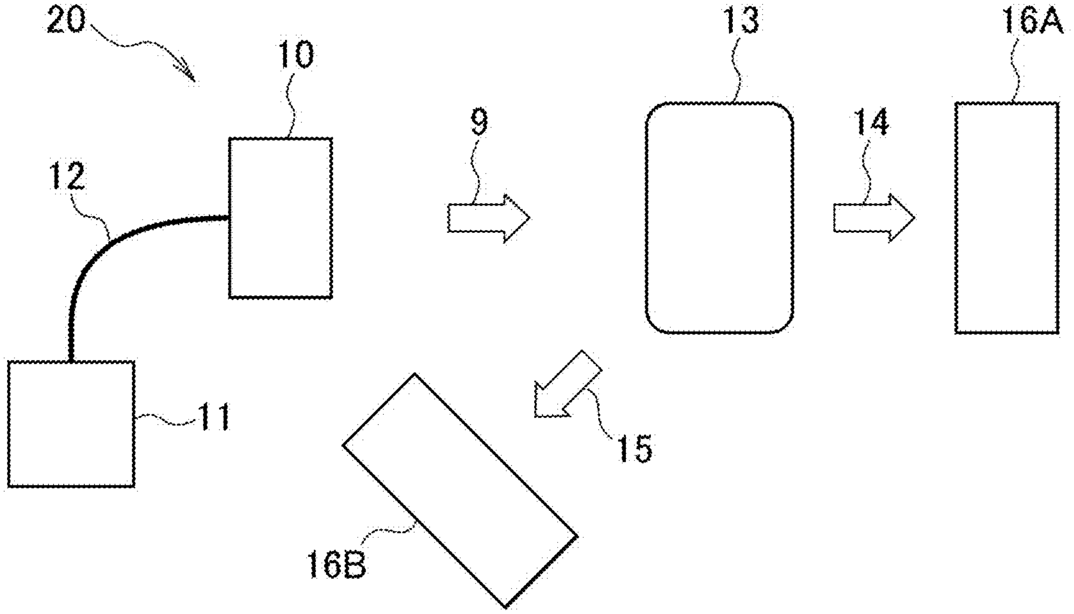
FIG. 2 is a schematic view illustrating an example of an electronic apparatus according to the present embodiment.

FIG. 2 schematically illustrates an example of an electronic apparatus according to the present embodiment. An electronic apparatus 20 includes the light emitting device 10, and a power supply circuit 11 is electrically connected to the light emitting device 10 through a conductor 12. The power supply circuit 11 supplies power to the solid-state light-emitting element 1 of the light emitting device 10. The light emitting device 10 converts the electrical energy supplied from the power supply circuit 11 into light energy and outputs the light energy as output light 9. Note that the light emitting device 10 in FIG. 2 is configured to emit output light 9 that includes near-infrared light.

The electronic apparatus 20 further includes a first detector 16A and a second detector 16B. The first detector 16A detects a transmitted light component 14 of the output light 9 emitted from the light emitting device 10 onto an irradiated object 13. Specifically, the first detector 16A detects near-infrared light in the transmitted light component 14 that has passed through the irradiated object 13. The second detector 16B detects a reflected light component 15 of the output light 9 radiated from the light emitting device 10 onto the irradiated object 13. Specifically, the second detector 16B detects near-infrared light in the reflected light component 15 that has been reflected by the irradiated object 13.

In the electronic apparatus 20 having this kind of configuration, the output light 9 including near-infrared light is radiated on the irradiated object 13 from the light emitting device 10, and the transmitted light component 14 that has passed through the irradiated object 13 and the reflected light component 15 reflected by the irradiated object 13 are detected by the first detector 16A and the second detector 16B, respectively. Thus, by means of the electronic apparatus 20, it becomes possible to detect information regarding characteristics of the irradiated object 13 involving near-infrared light.

Various types of photodetectors can be used for the first detector 16A and the second detector 16B. Specifically, depending on the form of use of the electronic apparatus, it is possible to use a quantum-type photodetector (photodiode, phototransistor, photo IC, CCD image sensor, CMOS image sensor, or the like) that detects the charge generated when light is input to a PN junction of a semiconductor. As a photodetector, it is also possible to use a thermal-type photodetector (thermopile using the thermoelectric effect, pyroelectric element using the pyroelectric effect, or the like) that detects change in an electrical property caused by a temperature increase due to heat generated when light is received, an infrared film that is sensitive to light, or the like.

As the first detector 16A and the second detector 16B, a single element using a single photoelectric conversion element may be used, or an imaging element having an integrated photoelectric conversion element may be used. The imaging element may have a linear form disposed in one dimension, or may have a planar form disposed in two dimensions. An imaging camera can also be used as the first detector 16A and the second detector 16B.

Note that although the electronic apparatus 20 of FIG. 2 includes both the first detector 16A and the second detector 16B, it is sufficient for the electronic apparatus 20 to include at least one of the first detector 16A or the second detector 16B.

Furthermore, the electronic apparatus of the present embodiment can be used as an inspection device, detection device, monitoring device, or a sorting device for irradiated objects using the output light. The near-infrared light component of the output light has the property of passing through most substances. Thus, by adopting a configuration in which near-infrared light is radiated from outside of a substance and the transmitted light or reflected light is detected, the internal state, the presence or absence of foreign substances, and so forth can be inspected without destroying the substance.

Furthermore, a near-infrared light component is invisible to the human eye, and its reflection characteristics are dependent on the substance. Thus, by adopting a configuration in which an object is irradiated with near-infrared light and the reflected light is detected, it is possible to detect people, flora and fauna, objects, and the like even in the dark and so forth without being perceived by humans.

In addition, the electronic apparatus of this embodiment can inspect the internal state of substances, the presence or absence of foreign substances, and so forth, determine the quality of substances, and select good-quality products and defective products, without destroying substances. It is thus possible for the electronic apparatus to sort objects by further providing a mechanism to sort irradiated objects of a normal state and irradiated objects of an abnormal state.

The electronic apparatus of this embodiment can be used for medical uses, veterinary uses, biotechnology uses, agriculture, forestry, and fishery industry uses, livestock industry uses (meat, meat products, dairy products, and the like), and manufacturing industry uses (foreign substance inspection, content quantity inspection, shape inspection, packaging state inspection, and the like). Furthermore, the electronic apparatus can also be used for inspection of pharmaceutical products, animal testing, food products, beverages, agriculture, forestry, and fishery products, livestock products, and industrial products. That is, the electronic apparatus of this embodiment can also be used on any of the human body, flora and fauna, and objects, and in addition can also be used on any of gases, liquids, and solids.

The electronic apparatus of this embodiment is preferably used as a medical device, a treatment device, a beauty device, a health device, a care-related device, an assay device, a measurement device, or an evaluation device.

For example, for medical and biotechnology development purposes, the electronic apparatus of this embodiment can be used for inspection, detection, measurement, evaluation, assay, analysis, observation, monitoring, separation, diagnosis, treatment, purification, and so forth for the following: 1) blood, body fluids, and their components; 2) excretions (urine and feces); 3) proteins and amino acids; 4) cells (including cancer cells); 5) genes, chromosomes, and nucleic acids; 6) biological samples, bacteria, specimens, and antibodies; 7) biological tissue, organs, and blood vessels; and 8) skin diseases and alopecia.

Furthermore, for example, for beauty and health care purposes, the electronic apparatus of this embodiment can be used for inspection, detection, measurement, evaluation, assay, analysis, observation, monitoring, beautification, sanitation, growth promotion, health promotion, diagnosis, and so forth for the following: 1) skin; 2) hair and body hair; 3) oral, endodontic, and periodontal conditions; 4) ears and nose; and 5) vital signs.

For example, for purposes of the agriculture, forestry, and fishery industry, the livestock industry, and the manufacturing industry, the electronic apparatus of this embodiment can be used for inspection, detection, measurement, quantification, evaluation, assay, analysis, observation, monitoring, recognition, selection, sorting, and so forth for the following: 1) industrial products (including electronic members and electronic devices); 2) agricultural products (such as fruits and vegetables); 3) enzymes and bacteria; 4) marine products (fish, shellfish, crustaceans, and mollusks); 5) pharmaceutical products and biological samples; 6) food products and beverages; 7) the presence and state of people, animals, and objects; 8) the state of gases (including water vapor); 9) liquids, fluids, water, moisture, and humidity; 10) the shape, color, internal structure, and physical state of objects; 11) space, position, and distance; 12) the contamination state of objects; 13) the state of molecules and particles; and 14) industrial waste.

For example, for caregiving purposes, the electronic apparatus of this embodiment can be used to confirm excretion and for the identification, management, monitoring, and so forth of health conditions.

In this way, the electronic apparatus of this embodiment can be used for all kinds of uses such as inspection, detection, measurement, quantification, evaluation, assay, analysis, observation, monitoring, recognition, selection, and sorting.

EXAMPLES

The present embodiment will be described in additional detail below with by mean of examples, comparative examples, and reference examples; however, the present embodiment is not limited to these examples.

Examples 1 to 4 and Comparative Examples 1 to 4

First, as light emitting devices of examples 1 to 4, four types of light emitting devices having different thicknesses of wavelength converters (resin fluorescent films) were manufactured. The wavelength converters used in examples 1 to 4 were resin fluorescent films containing two types of near-infrared phosphors obtained from a phosphor manufacturer.

One of the two types of near-infrared phosphors (first phosphor) was a phosphor having a fluorescence peak wavelength of 735 nm. On the basis of fluorescence characteristics and evaluation results of scanning electron microscope images, the first phosphor was a $Cr^{3+}$-activated phosphor mainly including a composite metal oxide having a garnet-type crystal structure, and was deduced to be a $Gd_3Ga_2(GaO_4)_3:Cr^{3+}$ phosphor. Note that the central particle size of the first phosphor was 10 μm to 20 μm. The first phosphor had light absorption rates of 49% and 41% at wavelengths of 450 nm and 635 nm, respectively, and exhibited low light absorption rates of less than 50% for both blue light and red light.

The other of the two types of near-infrared phosphors (second phosphor) was a phosphor having a fluorescence peak wavelength of 820 nm. On the basis of fluorescence characteristics and evaluation results of scanning electron microscope images, the second phosphor was a $Cr^{3+}$-activated phosphor mainly including a composite metal oxide, and was deduced to be a $(Ga,Sc)_2O_3:Cr^{3+}$ phosphor. Note that the central particle size of the second phosphor was 10 μm to 20 μm. The second phosphor had light absorption rates of 40% and 30% at wavelengths of 450 nm and 635 nm, respectively, and exhibited low light absorption rates of less than 50% for both blue light and red light.

The wavelength converters used in examples 1 to 4 were manufactured as follows. First, the above first phosphor and second phosphor were prepared as phosphor powders. In addition, a two-liquid mixed type thermosetting silicone resin (product name: KER-2600A/B, manufactured by Shin-Etsu Chemical Co., Ltd.) was prepared as a sealant for the phosphor powders.

Next, the first phosphor (0.49 g), the second phosphor (0.50 g), and the silicone resin (agent 'A' 0.5 g, agent 'B' 0.5 g) were mixed and defoamed using a stirring and defoaming device to obtain a phosphor paste including the first phosphor, second phosphor, and silicone resin. Note that the stirring and defoaming device used was manufactured by THINKY CORPORATION, product name: Awatori Rentaro, model: ARE-310. The rotation speed in the mixing and defoaming process was set at about 2,000 rpm, and the processing time was set to 3 minutes. The phosphor filling percentage of the obtained phosphor paste was 15% by volume. The volume ratio of the two phosphors (first phosphor:second phosphor) was 4:6.

The phosphor paste thus obtained was applied on the light output surface of a commercially available blue LED as described below and cured to manufacture a resin fluorescent film that serves as a wavelength converter.

Specifically, a commercially available blue LED module was prepared in which 102 blue LED chips are mounted on a ceramic substrate (alumina material, length 28 mm, width 28 mm, thickness 1 mm).

Further, a sidewall serving as a reflector (light reflector) was provided around the multiple blue LED chips as follows. A thermosetting white silicone resin (product name: LPS-2428 TW, manufactured by Shin-Etsu Chemical Co., Ltd.) having high light reflection characteristics with a light reflectance of 90% or more was used for the sidewall. Note that the white silicone resin is widely known as "dam material".

To form the sidewall, the white silicone resin described above was first applied on the substrate. An automatic dispenser (model: ML-808FX, manufactured by Musashi Engineering, Inc.) was used to apply the white silicone resin. Using a syringe needle having an inner diameter of φ 0.51 mm, the white silicone resin was applied at a drawing speed of 1.0 mm/s under conditions of a coating gap of 0.75 mm and an air pressure of 175 kPa. After the white silicone resin was applied on the substrate, heating was performed in an atmosphere of 150° C. for 2 hours to form the sidewall.

Note that the sidewall had an annular shape, an external dimension of 13 mm in diameter, and a height of 705±25 μm. The white silicone resin had a high reflectance because the reflectance in the wavelength region of at least 450 nm or more and less than 750 nm is 90% or more and less than 98%.

Then, the phosphor paste was filled inside the annular sidewall, defoamed through vacuuming, and cured by heating in air at 150° C. for 2 hours. In this way, a resin fluorescent film serving as a wavelength converter was obtained. Note that an automatic dispenser (model: ML-5000XII, manufactured by Musashi Engineering, Inc.) was used to fill the phosphor paste. The phosphor paste was filled using a syringe needle having an inner diameter of φ 0.47 mm at an air pressure of 200 kPa.

The filling amount of the phosphor paste applied on the light output surface was adjusted by changing the filling time to 24, 28, 32, and 36 seconds, and four types of light emitting modules with wavelength converters of different thicknesses were manufactured. In this way, the light emitting modules of examples 1 to 4 having different thicknesses of wavelength converters were obtained.

Although the details are omitted, the height of the light emitting module from the substrate surface before and after the wavelength converter (resin fluorescent film) was provided was measured using a shape measuring device (one-shot 3D shape measuring device, VR-3200, manufactured by Keyence Corporation). As a result, the thicknesses of the wavelength converters of example 1, example 2, example 3, and example 4 were 183 μm, 226 μm, 324 μm, and 466 μm, respectively. Note that the thickness of the wavelength converters refers to the thickness from the main light extraction surface of LED chips. When the heights of the sidewalls were also measured, they were 705±25 μm, although there was a variation among samples.

Next, light emitting devices of examples 1 to 4 were manufactured using the light emitting modules obtained as described above. Specifically, an interference filter as an optical member was provided on the upper surface of the light emitting modules of each example. Note that the interference filter used was of the product name: Premium edgepass filter, product number: FELH0550 manufactured by Thorlabs Inc., and the cut-on wavelength was 550 nm. Thus, the light emitting devices of examples 1 to 4 as illustrated in FIG. 1A were obtained.

Note that in examples 1 to 4, the gap distance G between the wavelength converter and the interference filter (optical member) was measured. As a result, the gap distances G in example 1, example 2, example 3, and example 4 were approximately 350 μm, 320 μm, 250 μm, and 0 μm, respectively, when the interference filter was placed on the sidewall. By pressing the interference filter against the resin fluorescent film while reducing the height of the flexible sidewall, that is, eliminating the gap, the light emitting devices of examples 1 to 4 in which the interference filter was in contact with the resin fluorescent film were obtained.

Furthermore, as light emitting devices of comparative examples 1 to 4, light emitting devices without the interference filter were also manufactured. Specifically, the light emitting modules of examples 1 to 4 were each used as the light emitting devices of comparative examples 1 to 4.

Figure 3:
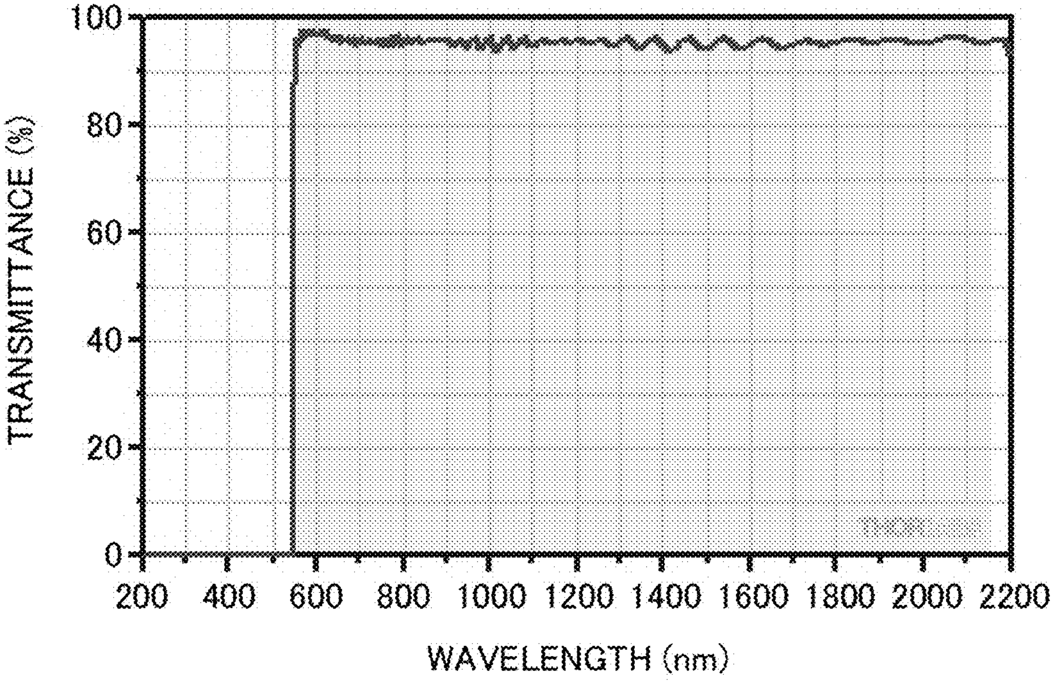
FIG. 3 is a graph illustrating spectral characteristics (relationship between wavelength and transmittance) of an interference filter as an optical member used in examples 1 to 4.

Here, FIG. 3 illustrates the light transmission characteristics of the interference filter used in examples 1 to 4. The interference filter used in examples 1 to 4 is an optical member having a dielectric multilayer film structure formed through vapor deposition, and reflects visible light on the short-wavelength side (violet to blue to green) and transmits near-infrared rays. Specifically, as can be seen from FIG. 3, the transmittance of a light component having a wavelength of at least 200 nm or more and less than 530 nm is less than 3%. That is, the interference filter hardly transmits visible light except yellow to deep red light. In contrast, the transmittance of a light component having a wavelength of at least 560 nm or more and less than 2200 nm, particularly less than 1000 nm, exceeds 92%. That is, the interference filter transmits deep red light and near-infrared rays.

Note that although the data is omitted, the reflectance is generally an inversion of the transmittance. Thus, in the interference filter, the reflectance of a light component having a wavelength of at least 380 nm or more and less than 530 nm exceeds 90%, and in particular, the reflectance of a light component having a wavelength of at least 400 nm or more and less than 500 nm exceeds 95%. That is, the interference filter reflects visible light (particularly blue light) with high efficiency.

Next, the operation of the light emitting devices of examples 1 to 4 and comparative examples 1 to 4 obtained as described above was confirmed. Specifically, when power (148 V, 100 mA) is applied to blue LED chips of each example light emitting device, blue light as primary light is emitted from the blue LED chips. Then, part of the light is absorbed by $Cr^{3+}$ contained in the resin fluorescent film, and converted to light (first fluorescence) that contains near-infrared rays as wavelength-converted light through the electronic energy transition of $Cr^{3+}$.

Here, in the light emitting devices of examples 1 to 4, the primary light transmitted through the wavelength converter without being absorbed by $Cr^{3+}$ is reflected by the interference filter, is radiated on the resin fluorescent film again, and is absorbed by $Cr^{3+}$ in the resin fluorescent film. Then, part of the absorbed primary light is converted again to light (second fluorescence) that contains near-infrared rays as the wavelength-converted light through the electronic energy transition of $Cr^{3+}$. In contrast, the above cycle is repeated until the non-absorbed primary light is reflected by the interference filter again and converted to near-infrared rays, or absorbed by the light absorber present in the resin fluorescent film and the like and practically lost. The near-infrared rays generated through this process pass through the wavelength converter and are output together with the first fluorescence.

Figure 4:
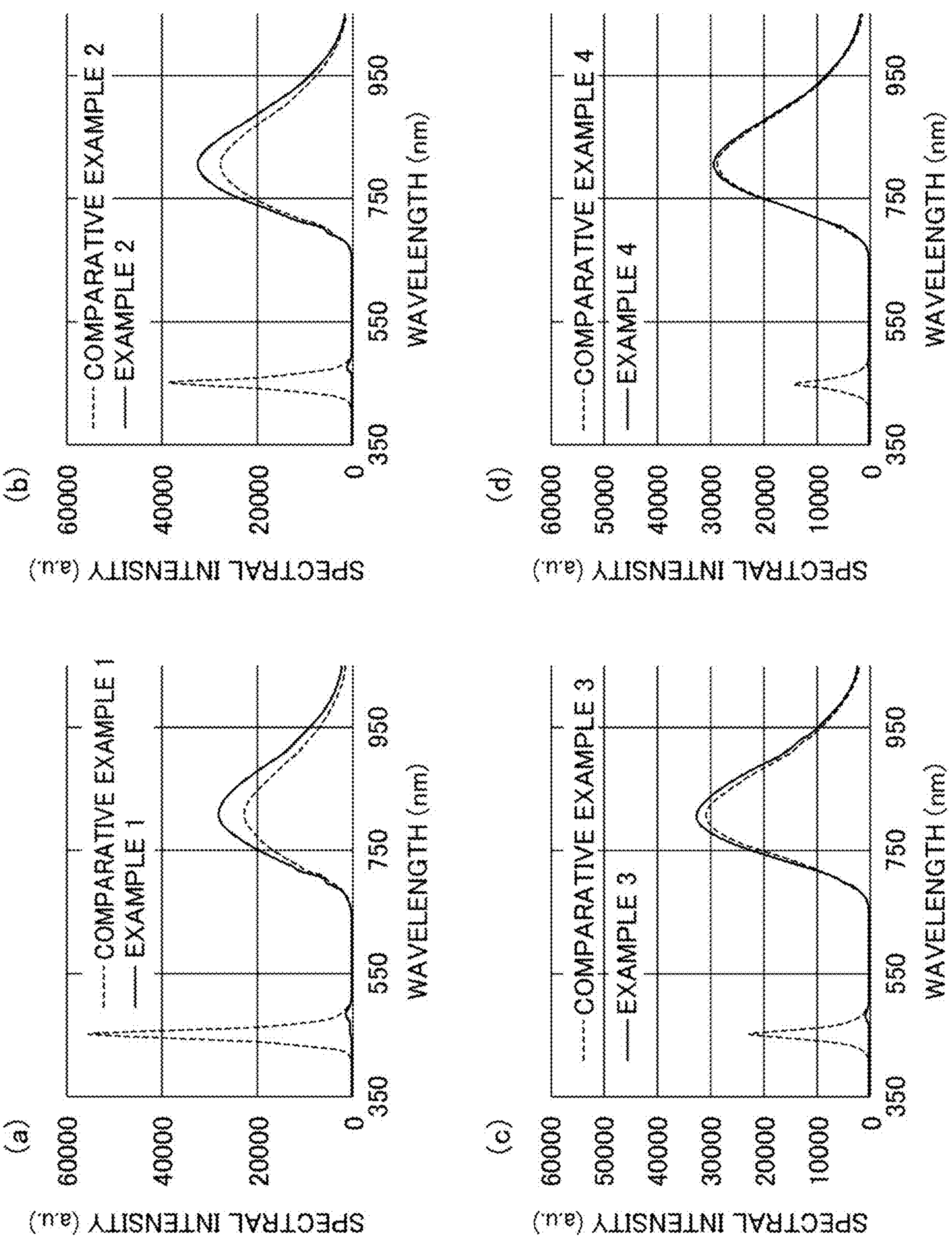
FIG. 4(*a*) is a graph illustrating spectral distributions of output light emitted by light emitting devices of example 1 and comparative example 1.

FIGS. 4(*a*), 4(*b*), 4(*c*), and 4(*d*) illustrate the spectral distributions of the light emitting devices of example 1, example 2, example 3, and example 4, respectively. FIGS. 4(*a*) to 4(*d*) also illustrate the spectral distributions of the light emitting devices of comparative examples 1 to 4 without an interference filter. As illustrated in FIGS. 4(*a*) to 4(*d*), the light emitting device of the examples can greatly reduce the light component of the primary light and increase the intensity of the fluorescent component due to $Cr^{3+}$ in the resin fluorescent film.

Specifically, the fluorescence intensity at the fluorescence peak wavelength of example 1 was 123% when the fluorescence intensity of comparative example 1 without the interference filter was set to 100%. The fluorescence intensity at the fluorescence peak wavelength of example 2 was 116% when the fluorescence intensity of comparative example 2 without the interference filter was set to 100%. The fluorescence intensity at the fluorescence peak wavelength of example 3 was 106% when the fluorescence intensity of comparative example 3 without the interference filter was set to 100%. The fluorescence intensity at the fluorescence peak wavelength of example 4 was 103% when the fluorescence intensity of comparative example 4 without the interference filter was set to 100%. That is, in the light emitting devices of examples 1 to 4, it was possible to observe $Cr^{3+}$ fluorescence that was enhanced to 103% or more and less than 130% relative to the light emitting devices of comparative examples 1 to 4.

In the light emitting devices of example 1, example 2, example 3, and example 4, the percentages of the peak intensity of the primary light relative to the fluorescence intensity of the fluorescence peak wavelength were 5.5%, 5.4%, 2.5%, and 1.5%, respectively. That is, the primary light intensity percentage, which is the percentage of the peak intensity of the primary light relative to the fluorescence intensity of the fluorescence peak wavelength, was a low intensity of less than 6%. Thus, it was found that the light emitting devices of examples 1 to 4 emit output light in which most of the light components are occupied by $Cr^{3+}$ fluorescence.

Note that it was found from examples 1 to 4 that the percentage increase in fluorescence intensity was larger as the thickness of the resin fluorescent film was thinner, and that a thinner resin fluorescent film of 300 μm or less in thickness was more advantageous in obtaining strong fluorescence. The reason for this is thought to be that as the wavelength converter is thinner in thickness, the number of photons of the primary light increases which pass through the wavelength converter without being absorbed by $Cr^{3+}$ in the wavelength converter, and thus the number of photons increases which are reflected by the interference filter, reabsorbed by $Cr^{3+}$, and wavelength-converted.

Examples 5 to 8 and Comparative Example 5

First, in the same manner as in example 1, a sidewall serving as a reflector was provided around multiple blue LED chips, and the inside of the sidewall was filled with a phosphor paste and then heat-cured to obtain a light emitting module. Note that the same blue LED module, white silicone resin for the sidewall, and phosphor paste as in example 1 were used. The filling method and filling time of the phosphor paste were also the same as in example 1, and thus the thickness of the resin fluorescent film in the light emitting module was about 180 μm.

On the upper surface of the light emitting module thus manufactured, an interference filter as an optical member was provided in the same manner as in example 1 and the light emitting devices of examples 5 to 8 were obtained. Note that as the interference filter, product name: short-wavelength cut filter manufactured by Asahi Spectra Co., Ltd. was used. In example 5, example 6, example 7, and example 8, cutoff wavelengths of the interference filter used were 490 nm, 590 nm, 690 nm, and 730 nm, respectively.

A light emitting device without an interference filter was also manufactured as the light emitting device of comparative example 5. Specifically, the light emitting module of examples 5 to 8 was used as the light emitting device of comparative example 5.

Figure 5:
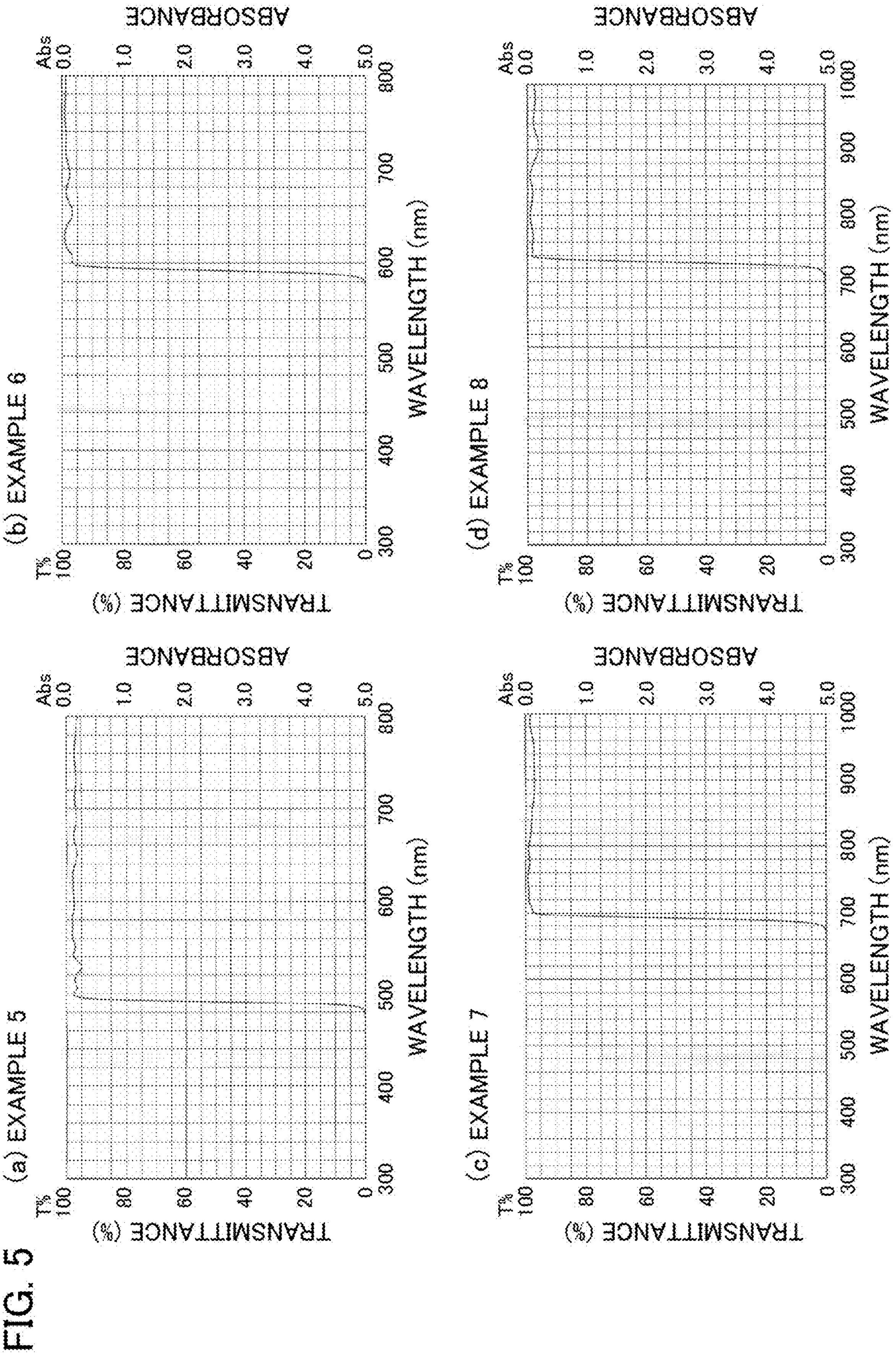
FIG. 5(*a*) is a graph illustrating spectral characteristics (relationship between wavelength, transmittance, and absorbance) of an interference filter as an optical member used in example 5.

Here, FIG. 5 illustrates the light transmission characteristics of interference filters used in examples 5 to 8. The interference filters used in examples 5 to 8 are also an optical member having a dielectric multilayer film structure, and reflect visible light on the short-wavelength side and transmit near-infrared rays. Specifically, as can be seen from FIG. 5, the transmittance of a light component having a wavelength of at least 300 nm or more and less than 480 nm is less than 3%. That is, at least ultraviolet light and short-wavelength visible light (violet to blue light) are hardly transmitted. More specifically, the transmittance of a light component having a wavelength of 300 nm or more and less than "a cutoff wavelength-10 nm" is less than 3%, and light having a wavelength of 300 nm or more and less than "a cutoff wavelength-10 nm" is hardly transmitted.

In contrast, as can be seen from FIG. 5, the transmittance of a light component having a wavelength of at least 750 nm or more and less than 1,000 nm exceeds 95%. That is, at least deep red light and near-infrared rays are transmitted. More specifically, the transmittance of a light component having "a cutoff wavelength+10 nm" or more and less than 1,000 nm exceeds 95%, and most of the light having "cutoff wavelength+10 nm" or more and less than 1,000 nm is transmitted.

Note that although data are omitted, the reflectance of a light component having a wavelength of at least 300 nm or more and less than 480 nm exceeds 90%, and the reflectance of a light component having a wavelength of 300 nm or more and less than "cutoff wavelength—10 nm" exceeds 90%. In particular, the reflectance of a light component having a wavelength of 400 nm or more and less than 500 nm exceeds 95%.

Next, the operation of light emitting devices of examples 5 to 8 and comparative example 5 obtained as described above was confirmed. Specifically, when power (148 V, 100 mA) was applied to the blue LED chips of each example light emitting device, blue light as primary light was emitted from the blue LED chips. As in examples 1 to 4, generated near-infrared rays (first fluorescence and second fluorescence) passed through the wavelength converter and were output to the outside of the light emitting device.

Figure 6:
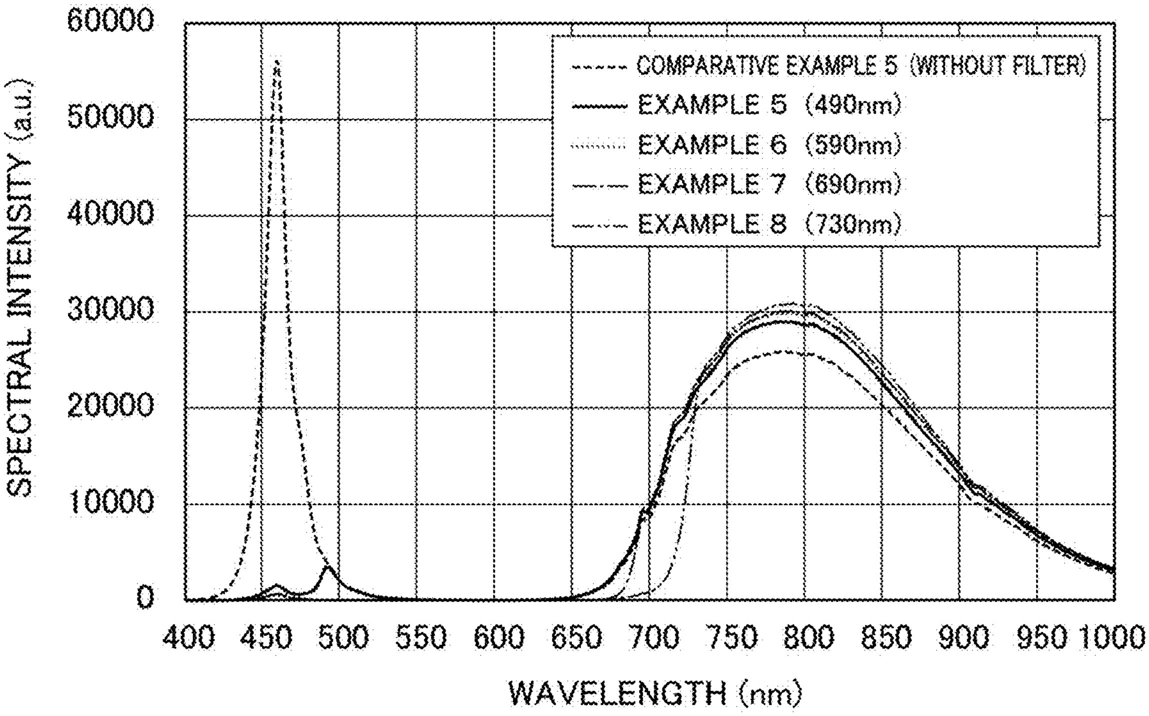
FIG. 6 is a graph illustrating spectral distributions of output light emitted by light emitting devices of examples 5 to 8 and comparative example 5.

FIG. 6 illustrates spectral distributions of output light emitted from the light emitting devices of example 5, example 6, example 7, example 8, and comparative example 5. As can be seen from FIG. 6, the light emitting devices of examples 5 to 8 can greatly reduce the light component of primary light and increase the intensity of the fluorescent component due to $Cr^{3+}$ in the resin fluorescent film, as in examples 1 to 4.

Specifically, the fluorescence intensity at the fluorescence peak wavelength of example 5 was 112% when the fluorescence intensity of comparative example 5 without the interference filter was set to 100%. The fluorescence intensity at the fluorescence peak wavelength of example 6 was 115% when the fluorescence intensity of comparative example 5 without the interference filter was set to 100%. The fluorescence intensity at the fluorescence peak wavelength of example 7 was 117% when the fluorescence intensity of comparative example 5 without the interference filter was set to 100%. The fluorescence intensity at the fluorescence peak wavelength of example 8 was 120% when the fluorescence intensity of comparative example 5 without the interference filter was set to 100%. That is, in the light emitting devices of examples 5 to 8, it was possible to observe $Cr^{3+}$ fluorescence enhanced to more than 110% and less than 130% relative to the light emitting device of comparative example 5.

The primary light intensity rates in the light emitting devices of example 5, example 6, example 7, and example 8 were 12.1%, 1.9%, 2.2%, and 2.3%, respectively, which were low intensity rates of less than 13%. In particular, the primary light intensity rates of light emitting devices using interference filters having a cutoff wavelength longer than 550 nm were low intensity rates of less than 2.5%. That is, it was found that the light emitting devices emitted output light in which $Cr^{3+}$ fluorescence accounted for most of the light components.

Note that it was found from examples 5 to 8 that the intensity increase rate of the fluorescence intensity was larger as the cutoff wavelength of the interference filter became longer, and that the interference filter (optical member) with the cutoff wavelength exceeding 600 nm was more advantageous in obtaining strong fluorescence. The reason for this may be as follows. The more a light emitting device using an interference filter with a longer cutoff wavelength, the greater the total number of photons of the primary light passing through the wavelength converter without being absorbed by $Cr^{3+}$ and photons of the visible light component on the short wavelength side of the light wavelength-converted by $Cr^{3+}$. Thus, it is considered that the primary light and wavelength-converted light reflected by the interference filter are reabsorbed by $Cr^{3+}$, and the number of photons to be wavelength-converted increases.

Note that in the light emitting device having the cutoff wavelength of the interference filter exceeding 700 nm, the output ratio of the visible light component of the short wavelength which has a large visibility is small. Thus, such a light emitting device has an advantageous configuration for applications in which it is not desired for people to notice that the light is turned on.

Example 9 and Comparative Example 9

First, a phosphor paste was manufactured using the same procedure as in example 1 except that the amounts of the first phosphor and the second phosphor were set to 0.89 g and 1.40 g, respectively. Note that the phosphor filling percentage in the phosphor paste of example 9 was 30% by volume, and the volume ratio of the two types of phosphors (first phosphor:second phosphor) was 3:7.

The phosphor paste thus obtained was dropped into a frame provided on a glass substrate using a dispenser, and a squeegee was used to smooth and flatten the surface of the dropped phosphor paste. Note that the dispenser was manufactured by Musashi Engineering, Inc., model: ML-5000XII. The glass substrate was 200 mm long, 200 mm wide, and 1 mm thick. The phosphor sheet was then obtained by removing the frame and curing in an atmosphere of 150° C. for 2 hours. The phosphor sheet obtained was then peeled off from the glass substrate using tweezers to obtain a wavelength converter. Note that the wavelength converter obtained was 5 mm long, 5 mm wide, and 170 μm thick.

As a precaution, the fluorescence characteristics of the phosphor sheet obtained were evaluated under red light excitation conditions at a wavelength of 660 nm using an absolute PL quantum yield spectrometer (C9920-02, manufactured by Hamamatsu Photonics K.K.). As a result, the internal quantum efficiency (IQE) of the phosphor sheet was 90%, the light absorption rate (Abs.) was 30%, and the fluorescence peak wavelength was 815 nm.

Next, a light emitting device with the structure illustrated in FIG. 1A was manufactured using the phosphor sheet thus manufactured. More specifically, the phosphor sheet was attached to the main light extraction surface of a surface mount type commercial red LED package (product number: SMBB660D-1100, manufactured by Ushio Inc.) in contact with the main light extraction surface by using a transparent silicone resin as an adhesive. Note that the red LED package was manufactured by Ushio Inc., product number: SMBB660D-1100. Furthermore, an interference filter (cut-off wavelength: 730 nm) was placed on the phosphor sheet and fixed, thereby obtaining the light emitting device of example 9.

As the light emitting device of comparative example 9, a light emitting device without an interference filter was also manufactured. Specifically, the red LED package to which the phosphor sheet of example 9 was attached was used as the light emitting device of comparative example 9.

Next, the operation of the light emitting devices of example 9 and comparative example 9 obtained as described above was confirmed. Specifically, when power (2.2 V, 100 mA) was applied to the red LED chips of each example, red light as primary light was emitted from the red LED chips. As in examples 1 to 8, the generated near-infrared ray (first fluorescence and second fluorescence) passed through the wavelength converter and were output to the outside of the light emitting device.

Figure 7:
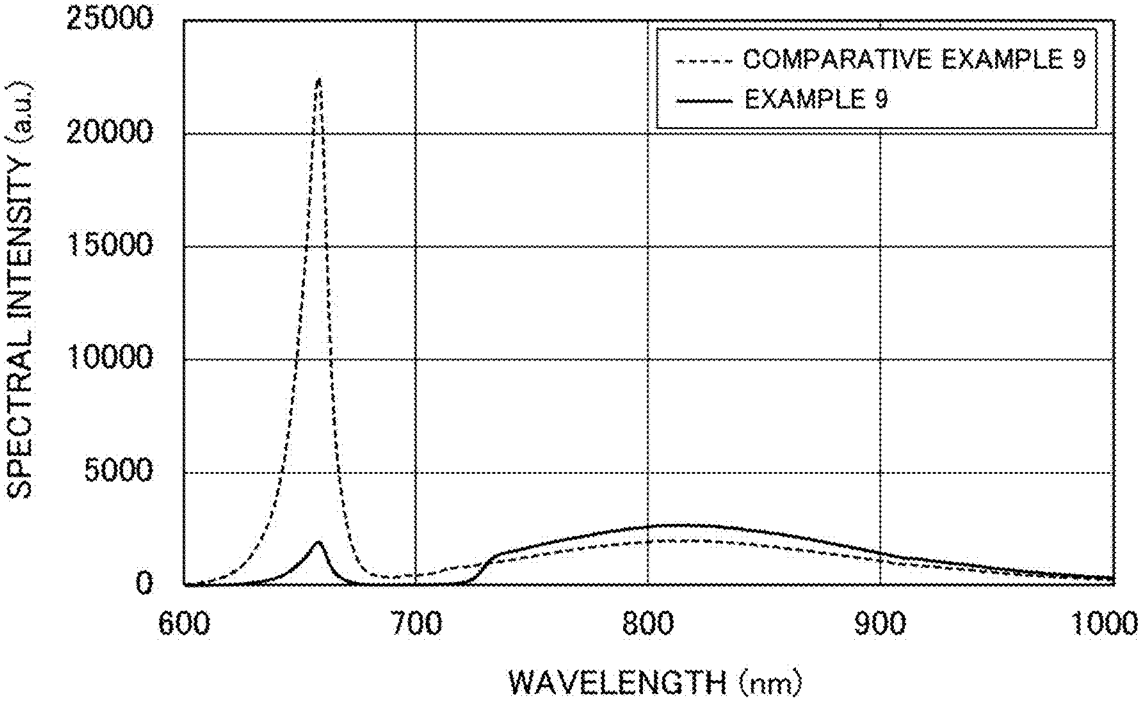
FIG. 7 is a graph illustrating spectral distributions of output light emitted by light emitting devices of example 9 and comparative example 9.

FIG. 7 illustrates the spectral distribution of output light emitted from the light emitting device of example 9 as a solid line. FIG. 7 also illustrates the spectral distribution of the output light emitted from the light emitting device of comparative example 9 without the interference filter as a dotted line. As can be seen from FIG. 7, the light emitting device of example 9 can greatly reduce the light component of primary light and increase the intensity of the fluorescent component due to $Cr^{3+}$ in the resin fluorescent film, as in examples 1 to 8.

Specifically, the fluorescence intensity at the fluorescence peak wavelength of example 9 was 135% when the fluorescence intensity of comparative example 9 without using the interference filter was set to 100%. That is, in the light emitting device of example 9, it was possible to observe $Cr^{3+}$ fluorescence enhanced to 135% relative to the light emitting device of comparative example 9. Thus, it can be said that in the light emitting device of example 9, it is possible to observe $Cr^{3+}$ fluorescence enhanced to approximately more than 100% and less than 140% relative to the light emitting device of comparative example 9.

The primary light intensity rate in the light emitting device of example 9 was 72%, which was the low intensity rate less than 75%. That is, it was found that the light emitting device emits output light in which the primary light intensity is at least smaller than the fluorescence intensity of $Cr^{3+}$ and most of the light component is occupied by the fluorescence of $Cr^{3+}$.

Note that although the reason is unclear, it was found that the ratio of increase in the fluorescence intensity is larger as the peak wavelength of the primary light emitted from the solid-state light-emitting element becomes longer wavelength, and thus the longer wavelength primary light is advantageous in obtaining strong fluorescence.

Reference Example

There are illustrated fluorescence characteristics of a phosphor containing $Cr^{3+}$ that absorbs primary light on the basis of a forbidden transition-type electronic energy transition. Specifically, the fluorescence characteristics of resin fluorescent films with different thicknesses using $(Gd,La)_3Ga_2(GaO_4)_3:Cr^{3+}$ phosphor (GLGG phosphor) are evaluated under irradiation with blue light (wavelength 450 nm).

First, the GLGG phosphor was prepared through an orthodox solid phase reaction using the following compound powders as the main raw materials.

- Gadolinium oxide ($Gd_2O_3$): purity 3N, manufactured by Nippon Yttrium Co., Ltd.
- Lanthanum hydroxide ($La(OH)_3$): purity 3N, manufactured by Shin-Etsu Chemical Co., Ltd.
- Gallium oxide ($Ga_2O_3$): purity 4N, manufactured by Nippon Rare Metal, Inc.
- Chromium oxide ($Cr_2O_3$): purity 3N, manufactured by Kojundo Chemical Laboratory Co., Ltd.

Specifically, first, the above raw materials were weighed to produce a compound of a stoichiometric composition $(Gd_{0.95}La_{0.05})_3$ $(Ga_{0.97}Cr_{0.03})_2$ $(GaO_4)_3)$ by means of a chemical reaction. Then, the phosphor raw material was prepared by mixing the weighed raw materials. Next, the phosphor raw material was placed in an alumina firing vessel and fired for 2 hours in air at 1500° C. using a box-type electric furnace. Note that the temperature increase/decrease rate during firing was set at 300° C./h. The obtained fired product was disintegrated by hand using a mortar and pestle, and then the coarse particles were removed. As a result, a GLGG phosphor in powder form represented by the composition formula of $(Gd_{0.95}La_{0.05})_3$ $(Ga_{0.97}Cr_{0.03})_2$ $(GaO_4)_3$ was obtained.

Next, a resin fluorescent film was manufactured using the GLGG phosphor. Specifically, the resin fluorescent film was obtained by mixing silicone resin with the GLGG phosphor and then curing a phosphor paste obtained by performing defoaming treatment.

Note that the above phosphor paste was manufactured as follows. First, the silicone resin and GLGG phosphor were weighed such that the filling percentage of the phosphor powder in the resin was 30% by volume. A two-component addition curing type silicone resin (product name: KER-2500A/B, manufactured by Shin-Etsu Chemical Co., Ltd.) was used as the silicone resin. Next, the silicone resin and phosphor powder were mixed using a mortar and pestle. Then, the mixture obtained was subjected to vacuuming (defoaming treatment) and the phosphor paste was obtained.

The above resin fluorescent film was manufactured as follows. First, a pair of tapes having a thickness of 100 μm were attached to a glass substrate with an equal width of 15 mm. Then, the phosphor paste was dropped between the paired tapes, the surface was smoothed using a squeegee, and the tapes were peeled off. Furthermore, the phosphor paste was cured by heating in an atmosphere of 150° C. for 2 hours to obtain a phosphor sheet. The obtained phosphor sheet was then peeled off from the glass using tweezers and cut into appropriate sizes (10 mm in length and width) with scissors. In this way, a resin fluorescent film was obtained. Note that as resin fluorescent films, three types of fluorescent films (thickness: 100 μm, 196 μm, 270 μm) with different thicknesses were manufactured.

The fluorescence characteristics of the obtained resin fluorescent films were evaluated using the above absolute PL quantum yield spectrometer. Table 1 shows the results of the evaluation of the resin fluorescent films under blue light excitation at a wavelength of 450 nm.

TABLE 1

| Thickness (μm) | Fluorescence peak wavelength (nm) | Internal quantum efficiency (%) | Light absorption rate (%) |
|---|---|---|---|
| 100 | 732 | 87 | 49 |
| 196 | 732 | 91 | 58 |
| 270 | 732 | 90 | 60 |

As can be seen from Table 1, resin fluorescent films using the GLGG phosphor have a high photon conversion efficiency (internal quantum efficiency) of 85% or more, particularly 90% or more (less than 100%). The light absorption rate of blue light increases within the range of 49% or more and 60% or less as the thickness increases. However, the level of these light absorption rates is smaller than those of resin fluorescent films (80% or more) for general LED lighting with similar thicknesses. That is, the light absorption rate of a resin fluorescent film for general LED lighting is 80% or more, while that of the resin fluorescent film using the GLGG phosphor is less than 70%, particularly less than 65%.

As described above, the light absorption rates of resin fluorescent films of the GLGG phosphor containing $Cr^{3+}$ are less than 70%. Since the fluorescent ion of the phosphor is $Cr^{3+}$, it is assumed that the resin fluorescent films of examples 1 to 9 have similar absorption rates.

Although the present embodiment has been described above, the present embodiment is not limited thereto, and various modifications are possible within the scope of the gist of the present embodiment.

The entire contents of Japanese Patent Application No. 2021-124398 (filed Jul. 29, 2021) are incorporated herein by reference.

INDUSTRIAL APPLICABILITY

The present disclosure provides a light emitting device obtained by combining a solid-state light-emitting element and a phosphor exhibiting light absorption based on a forbidden transition-type electronic energy transition and capable of enhancing the output intensity of fluorescence emitted from the phosphor. Furthermore, the present disclosure provides an electronic apparatus using the light emitting device having an enhanced fluorescence output intensity.

REFERENCE SIGNS LIST

1 Solid-state light-emitting element
2 Wavelength converter
3 Optical member
4 Substrate
6 Primary light
7 First fluorescence
8 Second fluorescence
9 Output light
10 Light emitting device
20 Electronic apparatus

The invention claimed is:

1. A light emitting device, comprising:

a solid-state light-emitting element that emits primary light;

a wavelength converter that includes a phosphor containing a fluorescent ion which absorbs the primary light on the basis of a forbidden transition-type electronic energy transition; and an optical member that reflects the primary light while transmitting fluorescence emitted by the fluorescent ion; wherein the solid-state light-emitting element is arranged on a side of one surface of the wavelength converter and the optical member is arranged on a side of the other surface of the wavelength converter, the fluorescence emitted by the fluorescent ion passes through the optical member and is output to the outside, the wavelength converter absorbs the primary light emitted by the solid-state light-emitting element and converts it into a first fluorescence having a longer wavelength than that of the primary light, and absorbs the primary light reflected by the optical member and converts it into a second fluorescence having a longer wavelength than that of the primary light, the first fluorescence and the second fluorescence have a fluorescence peak within a wavelength range of 700 nm to 2500 nm, the second fluorescence accounts for more than 5% of an intensity of a light component making up the output light and derived from the fluorescence emitted by the fluorescent ion.

2. The light emitting device according to claim 1, wherein the optical member is in direct contact with the wavelength converter.

3. The light emitting device according to claim 1, wherein a wavelength difference between a primary light wavelength taking a maximum intensity value of the primary light and a first wavelength taking a maximum intensity value of the first fluorescence exceeds 200 nm.

4. The light emitting device according to claim 1, wherein the primary light is blue light having a maximum intensity value within a wavelength range of 435 nm or more and less than 480 nm.

5. The light emitting device according to claim 1, wherein the optical member has, in a range where an incident angle of light is 0° to 5°, a reflectance of 90% or more in a wavelength range of 350 nm or more and less than 500 nm and a transmittance of 90% or more in a wavelength range of 750 nm or more and less than 1000 nm.

6. The light emitting device according to claim 1, wherein the fluorescent ion is $Cr^{3+}$.

7. An electronic apparatus, comprising:

the light emitting device according to claim 1.

8. A light emitting device, comprising:

a solid-state light-emitting element that emits primary light;

a wavelength converter that includes a phosphor containing a fluorescent ion which absorbs the primary light on the basis of a forbidden transition-type electronic energy transition; and an optical member that reflects the primary light while transmitting fluorescence emitted by the fluorescent ion; wherein the solid-state light-emitting element is arranged on a side of one surface of the wavelength converter and the optical member is arranged on a side of the other surface of the wavelength converter, the fluorescence emitted by the fluorescent ion passes through the optical member and is output to the outside, the wavelength converter absorbs the primary light emitted by the solid-state light-emitting element and converts it into a first fluorescence having a longer wavelength than that of the primary light, and absorbs the primary light reflected by the optical member and converts it into a second fluorescence having a longer wavelength than that of the primary light, the first fluorescence and the second fluorescence have a fluorescence peak within a wavelength range of 700 nm to 2500 nm, and the optical member has, in a range where an incident angle of light is 0° to 5°, a reflectance of 90% or more in a wavelength range of 350 nm or more and less than 500 nm and a transmittance of 90% or more in a wavelength range of 750 nm or more and less than 1000 nm.

* * * * *